US012782592B2

(12) United States Patent
Carruth et al.

(10) Patent No.: US 12,782,592 B2
(45) Date of Patent: Nov. 3, 2026

(54) GRID-LESS ION ANGLE DETECTOR

(71) Applicant: Tokyo Electron Limited, Tokyo (JP)

(72) Inventors: Megan Carruth, Austin, TX (US); Zhiying Chen, Austin, TX (US); Michael Hummel, Austin, TX (US); Joel Blakeney, Austin, TX (US); Shyam Sridhar, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 398 days.

(21) Appl. No.: 18/606,265

(22) Filed: Mar. 15, 2024

(65) Prior Publication Data

US 2025/0291076 A1 Sep. 18, 2025

(51) Int. Cl.
*H01J 37/244* (2006.01)
*G01T 1/29* (2006.01)
(Continued)

(52) U.S. Cl.
CPC .......... *G01T 1/2907* (2013.01); *H01J 37/023* (2013.01); *H01J 37/244* (2013.01);
(Continued)

(58) Field of Classification Search
CPC ..... G01T 1/2907; H01J 37/023; H01J 37/244; H01J 37/32935; H01J 37/3299;
(Continued)

(56) References Cited

U.S. PATENT DOCUMENTS 5,565,681 A 10/1996 Loewenhardt
7,572,737 B1 8/2009 Dhindsa
(Continued)

FOREIGN PATENT DOCUMENTS

JP 2004235090 A 8/2004

OTHER PUBLICATIONS

D. Gahan et al., "Retarding field analyzer for ion energy distribution measurements at a radio-frequency biased electrode", Review of Scientific Instruments, vol. 79, 033502, Mar. 10, 2008, Total pp. 10.
(Continued)

*Primary Examiner* — Sean Luck
(74) *Attorney, Agent, or Firm* — Slater Matsil, LLP

(57) ABSTRACT

An ion angle detector includes a front plate that includes an aperture configured to form an ion beam from incident ions. An ion collector of the detector is configured to measure ion flux from the ion beam. A linear actuator is mechanically coupled to the ion collector and configured to move the ion collector in a direction parallel to the ion beam. Ion angular distribution of a plasma may be measured using the detector by moving the ion collector parallel to the ion beam, measuring ion flux while moving the ion collector to obtain the flux as a function of distance from the source location, and obtaining the angular distribution from the flux and the distance. The ion angle detector may be disposed in a chamber of a plasma system that has a controller operatively coupled to the detector and configured to measure ion angular distribution.

20 Claims, 7 Drawing Sheets

(51) Int. Cl.
*H01J 37/02* (2006.01)
*H01J 37/32* (2006.01)

(52) U.S. Cl.
CPC .... *H01J 37/32935* (2013.01); *H01J 37/3299* (2013.01); *H01J 2237/057* (2013.01); *H01J 2237/24405* (2013.01); *H01J 2237/24528* (2013.01); *H01J 2237/3321* (2013.01); *H01J 2237/3348* (2013.01)

(58) Field of Classification Search
CPC ....... H01J 2237/057; H01J 2237/24405; H01J 2237/24528
See application file for complete search history.

(56) References Cited

U.S. PATENT DOCUMENTS

| | | | | |
|---|---|---|---|---|
| 7,777,179 | B2 | 8/2010 | Chen | |
| 7,875,859 | B2 | 1/2011 | Chen | |
| 8,847,159 | B2 | 9/2014 | Chen | |
| 11,264,212 | B1 | 3/2022 | Chen | |
| 2008/0032427 | A1 | 2/2008 | Lee | |
| 2020/0225368 | A1* | 7/2020 | Onouchi | H01J 37/244 |

OTHER PUBLICATIONS

Chang-Koo Kim et al., "Plasma molding over surface topography: Energy and angular distribution of ions extracted out of large holes", Journal of Applied Physics, vol. 91, No. 5, 2594-2603, Mar. 1, 2002, Total pp. 10.

Kimball Physics, "Detectors: Faraday Cup FC-73", Kimball Physics, Excellence in Electron and Ion Optics, 2023, Total pp. 04.

J. Liu et al., "Ion bombardment in rf plasmas", Journal of Applied Physics, vol. 68, 3916-3934, Oct. 15, 1990, Total pp. 19.

J. R. Pai et al., "Beam divergence and ion density measurements for an induction coupled ion beam source", Review of Scientific Instruments, vol. 63, 5234-5236, Nov. 1, 1992, Total pp. 04.

Alok Ranjan et al., "Energy distribution and flux of fast neutrals and residual ions extracted from a neutral beam source", Journal of Vacuum Science & Technology A, vol. 24, 1839-1846, Aug. 7, 2006, Total pp. 08.

J. R. Woodworth et al., "Experimental and theoretical study of ion distributions near 300 μm tall steps on rf-biased wafers in high density plasmas", Journal of Vacuum Science & Technology A, vol. 21, 147-155, Jan. 2003, Total pp. 09.

J. R. Woodworth et al., "Ion distribution functions in inductively coupled radio frequency discharges in argon-chlorine mixtures", Journal of Vacuum Science & Technology A, vol. 15, 3015-3023, Nov. 1, 1997, Total pp. 10.

* cited by examiner

GRID-LESS ION ANGLE DETECTOR

TECHNICAL FIELD

The present invention relates generally to ion detectors for plasma characterization, and, in particular embodiments, to apparatuses, systems, and methods for the detection of ion angle and related properties of a plasma.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes. Many plasma processing techniques exist, including chemical dry etching (CDE) (e.g., plasma ashing), physical or sputter etching, reactive ion etching (RIE), plasma-enhanced chemical vapor deposition (PE-CVD), plasma-enhanced atomic layer etch (PE-ALE), atomic layer deposition (PE-ALD), and others.

The minimum feature sizes of semiconductor devices continue to shrink at each successive technology node to reduce cost (e.g., by roughly doubling the component packing density). The demand for low cost electronics with high functionality has driven innovations in patterning complex three-dimensional (3D) device structures with feature sizes down to a few nanometers. With lateral dimensions approaching the scale of molecules and atoms, plasma technology faces the challenge of fabricating very high aspect ratio structures with processes that can also meet the stringent precision, uniformity, stability, and repeatability required for IC manufacturing. An increasing number of IC designs, such as nonvolatile flash memory (NVM) and dynamic random-access memory (DRAM), are adopting high density 3D structures for volume manufacturing that may require precise control, at almost atomic dimensions. Plasma processes such as high aspect ratio contact (HARC) etching and PE-ALE are sensitive to kinetic energy and direction of ions during processing and the precision of the etch process rely on a narrow distribution of ion energy and ion angle. Precise measurements of these plasma properties are desirable to optimize and enable these plasma processes. Further innovations in the detectors and detection methods for ion energy distribution (IED) and ion angular distribution (IAD) remain to be made.

Detecting ion angle of a plasma (and related properties derived therefrom, such as IAD, beam divergence, divergence angle, etc.) can be challenging. Ion angle detectors employ various strategies to achieve angular resolution. In one configuration, a planar electrically conductive grid (e.g., a microchannel plate) is placed between the plasma and a collector. The grid has multiple channels with an aspect ratio chosen to limit the angle of the ions passing through the grid to a known angle range. Measuring multiple ion angles is then achieved by physically rotating the grid relative to the ion source (e.g., the plasma) to change the angle of the ions passing through the grid. However, the use of a high aspect ratio grid greatly reduces the ion flux (especially when the grid is rotated). Further, the design and manufacture of the rotatable grid may be expensive and complex.

Channels with multiple angles may be included in the same grid, but multiple electrically-isolated ion collectors are then necessary, which increases cost, complexity, and the size of the ion angle detector. Another related configuration uses a hemispherical grid (rather than a planar grid). Multiple electrically-isolated collectors are implemented as concentric rings below the hemispherical grid allowing several ion angles to be simultaneously measured. Yet, manufacturing planar grids with multiple channel angles is already difficult, and hemispherical grids are even more difficult. Additionally, the angular resolution of both planar and hemispherical grid ion angle detectors is undesirably low, such as a few degrees.

Therefore, improved ion angle detectors that are able to accurately detect ion angle of a plasma without using a high aspect ratio grid and with high angular resolution are desirable.

SUMMARY

In accordance with an embodiment of the invention, an ion angle detector includes a front plate that includes an aperture configured to form an ion beam from incident ions, an ion collector configured to measure ion flux from the ion beam, and a first linear actuator mechanically coupled to the ion collector and configured to move the ion collector in a direction parallel to the ion beam.

In accordance with another embodiment of the invention, a method of measuring ion angular distribution of a plasma includes producing an ion beam from the plasma at a source location, moving an ion collector parallel to the ion beam from an initial distance from the source location to a final distance from the source location, measuring ion flux from the ion beam using the ion collector while moving the ion collector parallel to the ion beam to obtain the ion flux as a function of distance from the source location, and obtaining the ion angular distribution from the ion flux and the distance from the source location.

In accordance with still another embodiment of the invention, a plasma system includes a chamber configured to contain a plasma, an ion angle detector disposed within the chamber, an ion collector configured to measure ion flux from an ion beam, and a first linear actuator mechanically coupled to the ion collector and configured to move the ion collector in a direction parallel to the ion beam. The ion angle detector includes a front plate that includes an aperture configured to form the ion beam from the plasma. The plasma system further includes a controller operatively coupled to the ion angle detector. The controller includes a processor and a non-transitory computer-readable medium storing a program including instructions that, when executed by the processor, perform a method of measuring ion angular distribution of the plasma. The method includes moving the ion collector parallel to the ion beam from an initial distance from the aperture to a final distance from the aperture using the first linear actuator, measuring ion flux from the ion beam using the ion collector while moving the ion collector parallel to the ion beam to obtain the ion flux as a function of distance from the aperture, and obtaining the ion angular distribution from the ion flux and the distance from the aperture.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A shows a side view of the ion angle detector and FIG. 4B shows an overhead view of the ion angle detector in accordance with embodiments of the invention;

Figure 1:
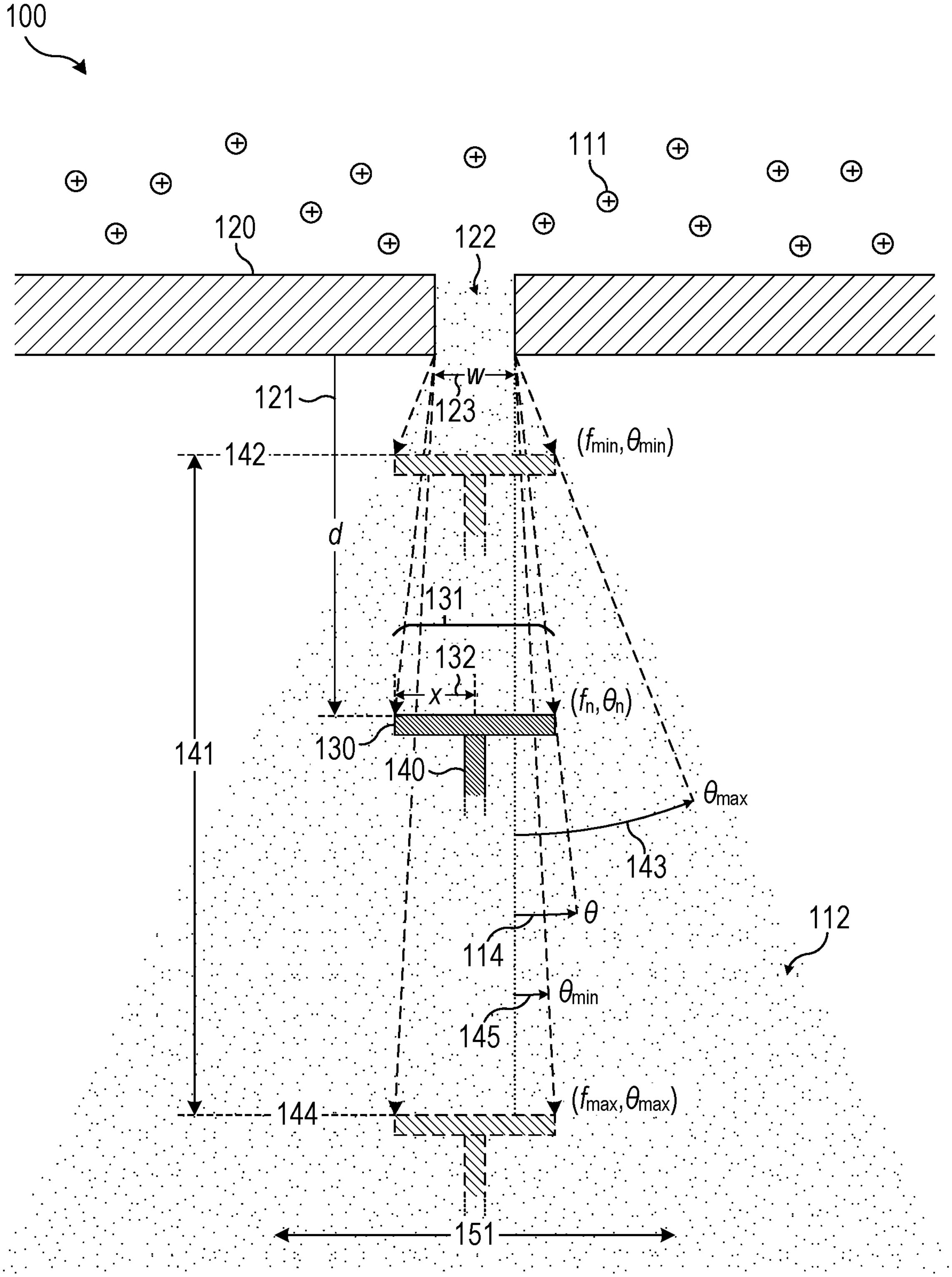
FIG. 1 illustrates an example ion angle detector that includes a linear actuator configured to move an ion collector in a direction parallel to an ion beam while the ion collector measures the ion flux from the ion beam in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

Control of IAD (ion angular distribution) is desirable for many plasma processes and becomes more and more important as the size of the features decreases (e.g., in the range of nanometers, such as 3 nm and lower). For example, etching processes, such as HARC etching and PE-ALE are highly sensitive to both ion energy and ion angle. Additionally, as the aspect ratio of features increases, knowledge of the properties of the ions at different distances from the source becomes more valuable.

While conventional techniques for measuring ion angle of a plasma exist, they suffer from various drawbacks, such as complex design, high cost, low sensitivity, and low angular resolution. For example, some conventional ion angle detectors employ rotatable high aspect ratio grids to discriminate different ion angles. The high aspect ratio grids can undesirably reduce ion flux, especially when rotated. Hemispherical grids do not have to be rotated to achieve angular discrimination, but the already complex manufacturing processes necessary to fabricate planar grids is increased even further for a hemispherical grid. Perhaps more importantly, all of the grid-based conventional ion angle detectors have undesirably low angular resolution, such as on the order of a few degrees (i.e., each available measurement is separated by at least a few degrees, if not more).

In accordance with embodiments herein described, the invention proposes a grid-less ion angle detector. Specifically, the ion angle detector is grid-less in the sense that no grid is used to achieve angular resolution of the detected ions. Instead, in various embodiments, the grid-less ion angle detector includes an ion collector (i.e., an ion sensing device, such as a Faraday cup) configured to measure the ion flux from an ion beam. For example, the ion beam may be produced from an ion source, such as a plasma, using a plate with an aperture (e.g., with a sufficiently high aspect ratio). The ion collector is mechanically coupled to a linear actuator that is configured to move the ion collector in a direction parallel to the ion beam (i.e., in a direction towards or away from a source location of the ion beam).

While the ion collector is moved parallel to the ion beam, the ion flux from the ion beam may be measured to obtain the ion flux as a function of the distance from the source location. The IAD may then be obtained from the ion flux and the distance from the source location using known geometry (e.g., dimensions of the ion collector, dimensions of a structure that produces the ion beam, etc.). In particular, the ion angle measured at each distance may be obtained using the radius of the ion collector (which may be known and constant). The IAD may then be obtained by taking the derivative of the ion flux with respect to the measured ion angle. Alternatively (or as an approximation for the derivative), the IAD may be obtained by calculating the IAD at each measurement point by dividing the change in measured ion flux by the annular collection area corresponding to the change in measured ion angle. The grid-less ion angle detector may be disposed in a chamber of a plasma system and operatively coupled to a controller that has a processor configured to execute a program to measure the IAD of a plasma within the chamber.

Notably, the grid-less ion angle detector may also function as an ion energy detector by incorporating one or more ion energy selectors into the grid-less ion angle detector. Each ion energy selector is configured to exclude ions above and/or below a selected energy threshold so that the energy range of ions reaching the ion collector is known. The IED (ion energy distribution) may then be obtained from the measured ion flux at each energy or energy range. The ion energy selector may be implemented while maintaining the unobstructed path of the ions to the ion collector (e.g., from a plasma to a plate, through an aperture, and to the ion collector). For example, the ion energy selector may use electric or magnetic fields to select ions of a particular energy range.

Alternatively, the ion energy selector may use one or more grids (such as a repeller grid). The grid-less ion angle detector may still be considered grid-less even when including one or more repeller grids because repeller grids are not configured to discriminate ion angle (e.g., no voltage is applied while obtaining ion angle information) and because the repeller grids are thin (as opposed to grids used in conventional ion angle detectors that use high aspect ratio microchannels to discriminate ion angle).

The embodiment ion angle detectors described herein may have various advantages over conventional ion angle detectors. One possible benefit of the embodiment ion angle detectors over conventional ion angle detectors is the ability to measure ion angle (and ion energy in some embodiments) with high resolution (e.g., less than 1° increments). Ion beam properties may also be advantageously measured at various locations along the ion beam length (i.e., in a parallel direction along the ion beam) by the embodiment ion angle detectors. This may be valuable for many plasma processing applications, including etch applications, such as HARC etching. The manufacture and operation of the embodiment ion angle detectors may advantageously be less complex and less expensive than conventional ion angle detectors, such as those using planar or hemispherical grids.

The embodiment ion angular detectors may also have the advantage of being highly flexible. For example, both IAD and IED may be measured using the same ion angle detector in some embodiments. Ion beam divergence may also be obtained by measuring the ion flux while the ion collector is moved with the linear actuator. Other properties of interest, such as ion temperature may also be obtained from the ion angle information. Additional linear actuators may also be included to allow movement of the ion collector in a direction or directions perpendicular to the ion beam. The off-axis motion may allow the ion collector to be centered on the ion beam and provide the benefit of additional off-axis ion angle information (and off-axis ion energy information when ion energy can be measured).

Embodiments provided below describe various apparatuses, systems, and methods for the detection of ion angle and related properties of a plasma, and in particular embodiments, to ion angle detectors that include a linear actuator configured to move an ion collector in a direction parallel to an ion beam while the ion collector measures the ion flux from the ion beam. The following description describes the embodiments. FIG. 1 is used to describe an example ion angle detector. An ion angle detector that is also an ion energy detector is described using FIG. 2. Three more example ion angle detectors are described using FIGS. 3, 4A-4B, and 5. Another ion angle detector that is also an ion energy detector is described using FIG. 6. Qualitative graphs analogous to ion flux and IAD detectable by the example ion angle detectors is described using FIG. 7. An example plasma system that includes an example ion angle detector is described using FIG. 8 while FIG. 9 is used to describe an example method of measuring ion angular distribution.

FIG. 1 illustrates an example ion angle detector that includes a linear actuator configured to move an ion collector in a direction parallel to an ion beam while the ion collector measures the ion flux from the ion beam in accordance with embodiments of the invention.

Referring to FIG. 1, an ion angle detector 100 includes a structure configured to produce an ion beam 112 at one side of the structure (i.e., a "back" side, though this is merely a label of convenience) from ions 111 at another side of the structure (i.e., a "front" side). The ions 111 may be from any ion source, such as a plasma, for example. Although shown as positive ions, the ion angle detector 100 may also be configured to measure negative ions. In this specific example, the structure is implemented as a front plate 120 with an aperture 122 (e.g., having an aperture diameter 123 denoted as w and corresponding to the diameter of an opening in the back side of the front plate 120), but other types of structures may be used and other configurations of the front plate 120 and the aperture 122 are also possible. For example, the shape of the aperture 122 may be conical or some other shape, the front plate 120 curved, have a different thickness, etc. The front plate 120 and the aperture 122 are configured to be a source location of the ion beam 112.

The ion beam 112 travels in a direction away from the aperture 122, which is shown here to be perpendicular to the front plate 120 (although it does not have to be exactly so). An ion collector 130 (such as a Faraday cup, solid state detector, electronic multiplier, etc.) is positioned on the back side of the front plate 120 and is mechanically coupled to a parallel linear actuator 140 (parallel in the sense that the parallel linear actuator 140 is configured to move the ion collector 130 in a parallel direction 141 relative to the ion beam 112). That is, the aperture 122 and the front plate 120 are configured to produce the ion beam 112 so that it travels substantially away from (i.e., perpendicular to) the front plate 120 and the parallel linear actuator 140 is configured to move the ion collector 130 parallel to the path of the ion beam 112 (e.g., away from the aperture 122 and parallel to the axis of the aperture 122). Of course, the net angle of the ions in the ion beam 112 may not be perfectly along the axis of the aperture 122 (or neutral) in which case the axis of the ion beam 112 may not align exactly with the axis of the aperture 122. In this case, the parallel motion of the parallel linear actuator 140 may not be exactly parallel to the ion beam 112 (rather substantially parallel, having the dominant component being parallel to the ion beam 112, for example).

The front plate 120 may be formed of a single material (e.g., a conductive material) or multiple materials. In various embodiments, the front side of the front plate 120 is electrically conductive while the back side the front plate 120 is electrically insulating. In some embodiments, additional layers may also be included, such as an embedded grounded structure. One example might be an electrically conductive front surface of the front plate 120 that is at the same potential as a test substrate with an embedded ground structure prevent the ion beam 112 and the ion collector 130 from being influenced by the fields on the fronts side of the aperture 122.

The parallel linear actuator 140 may be any type of actuator (e.g., mechanical, electronic, etc., such as a linear drive) that is configured to move the ion collector 130 in a linear direction. In some cases, the parallel linear actuator 140 (or additional actuators) may even have movement capabilities beyond linear motion, but be configured to move the ion collector 130 linearly in at least one mode. Examples of additional motion of the ion collector 130 may be rotational motion (e.g., using a goniometer) and one or more perpendicular directions, such as perpendicular direction 151.

The parallel linear actuator 140 is configured to move the ion collector 130 within a range of distances that has a minimum parallel distance 142 and a maximum parallel distance 144. While the minimum parallel distance 142 is shown to be nonzero, the minimum parallel distance 142 may be as small as zero (i.e., at the back surface of the front plate 120) while the maximum parallel distance 144 may be as large as desired for a given application. Various considerations may be accounted for when determining the desired values of the minimum parallel distance 142 and the maximum parallel distance 144, such as the expected range of properties of the ions 111, the size and shape of both the aperture 122 and the ion collector 130, and others.

As depicted, the ion beam 112 spreads out after leaving the aperture 122 (the specifics of which may be determined by various factors, such as ion temperature, external forces acting on the ions (e.g., electric and magnetic fields), as well as forces between ions (repelling one another). At a given distance 121 (denoted as d) from the aperture 122, some fraction of the ion beam 112 (up to and including all of the ion beam 112) impinge on a collection area 131 of the ion collector 130. The ion collector 130 is configured to measure ion flux from the ion beam 112 by transducing the number of ions 111 that arrive at the collection area 131 (i.e., the ion flux) into a usable signal, such as electric current. The fraction of the ion beam 112 hitting the collection area 131 is the measured ion angle 114 (i.e., a solid angle θ of the ion beam 112). Due to the relative positioning of the aperture 122 and the ion collector 130, the ion angle 114 is at a maximum angle 143 ($\theta_{max}$) when the ion collector 130 is at the minimum parallel distance 142 and is at a minimum angle 145 ($\theta_{min}$) when the ion collector 130 is at the maximum parallel distance 144.

The ion angle detector 100 may be considered grid-less because the ion angle detector 100 is configured to resolve ion angle without the use of grid configured to discriminate angle (e.g., the ion angle detector 100 does not include a plate with multiple high aspect ratio microchannels). In the specific example given here, the ion beam 112 travels unobstructed from the aperture 122 to the ion collector 130 and the front side the front plate 120 is in direct fluid communication with the ion source. That is, there are no grids of any type shown in the ion angle detector 100. However, various grids may be included in the ion angle detector 100 while still allowing the ion angle detector 100 to be considered grid-less (i.e., grids that are not configured to discriminate ion angle). When grids are included that do not affect the ion angle, the path of the ion beam 112 may still be considered unobstructed (e.g., when compared to thick microchannel grids used in conventional ion angle detectors).

The ion collector 130 may be moved in any desired manner between the minimum parallel distance 142 and the maximum parallel distance 144. For example, the ion collector 130 may be moved by the parallel linear actuator 140 from the top (i.e., close to the aperture 122) to the bottom (i.e., far from the aperture 122), but of course any desired pattern, initial distance, and final distance is possible. The ion flux may be measured (e.g., as an ion current) at various distances to obtain the ion flux as a function of the distance 121 from the aperture 122. The ion angle 114 measured at each distance 121 can then be determined using a collection radius 132 (denoted as x, which may be known and constant) of the collection area 131 of the ion collector 130. Specifically, the measured ion angle 114 can be obtained using the formula $\theta=\tan^{-1}(x/d)$, which gives the ion angle 114 as a function of the distance 121. This be used to define the minimum angle 145 ($\theta_{min}$) as the inverse tangent of a ratio of the constant collection radius 132 to the maximum parallel distance 144 (as well as an analogous application of the formula for the maximum angle 143.

The ion flux f can then be obtained as a function of ion angle θ. The IAD can be obtained by taking the derivative of the ion flux with respect to the ion angle. Of course, other quantities related to ion angle can also be obtained, such as ion temperature, for example. Further, the ion collector 130 may also be manipulated in other ways to obtain more information. One example may be to configure the ion collector 130 to be rotatable (e.g., through use of a device such as a goniometer) so that rotational measurements may be made at each location along the beam as well as off-axis in embodiments where the ion collector 130 is configured to be moved in a direction perpendicular to the ion beam 112.

The parallel linear actuator 140 (e.g., a linear drive) may have a certain maximum linear resolution that determines the angular resolution of the ion angle detector 100. In various embodiments, the ion angle detector 100 is configured to measure the ion flux from the ion beam with an angular resolution higher than about 1° (e.g., as defined by the constant collection radius, the minimum distance, and the maximum linear resolution). An angular resolution higher than about 1° refers to the capability of the ion angle detector 100 to measured quantities at angular increments of about 1° or less. That is, an angular resolution of a few degrees (as in conventional ion angle detectors) is undesirably lower than an angular resolution of about 1°.

Although the actual dimensions of the various components of the ion angle detector 100 will depend on the specific details of a given application, some values are provided here as examples. In various embodiments, the aperture diameter 123 is on the order of tens to hundreds of microns, and is about 100 μm in one embodiment. Similarly, the thickness of the front plate 120 (i.e., the length of the aperture 122) is also on the order of tens to hundreds of microns is some embodiments, such as about 100 μm. The largest dimension of the collection area 131 (e.g., a diameter of a circular collection area) is on the order of millimeters in various embodiments, and is about 2 mm in one embodiment (making the collection radius 132 about 1 mm). The range from the minimum parallel distance 142 to the maximum parallel distance 144 may be on the order of centimeters. For example, in some embodiments, the parallel linear actuator 140 is configured to move the ion collector 130 over a distance of about 10 cm. In one embodiment, the minimum parallel distance 142 is about 1 cm and the maximum parallel distance 144 is about 10 cm (yielding a linear range of about 9 cm). The angular range is related to the linear range of the parallel linear actuator 140 and the collection radius 132, and includes ion angles less than about 10° in various embodiments, and ranges from about 6° to about 0.6° in the specific example discussed above.

Figure 2:
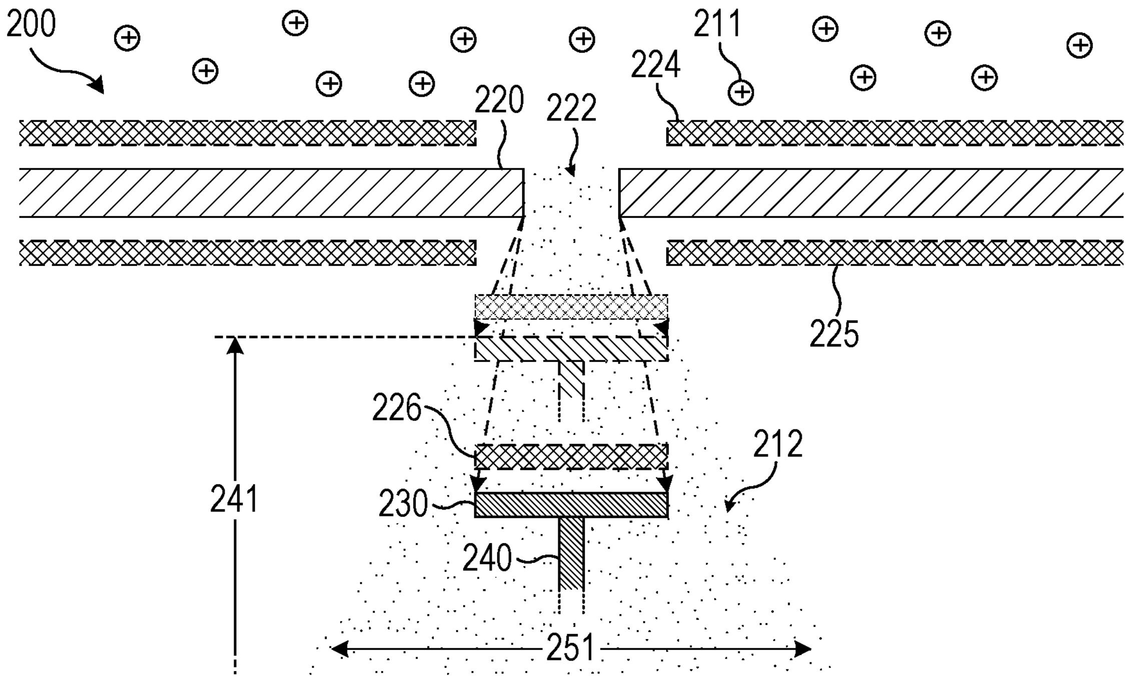
FIG. 2 illustrates an example ion angle detector that includes a linear actuator configured to move an ion collector in a direction parallel to an ion beam, and that also includes an ion energy selector configured to enable the ion angle detector to also function as an ion energy detector in accordance with embodiments of the invention.

FIG. 2 illustrates an example ion angle detector that includes a linear actuator configured to move an ion collector in a direction parallel to an ion beam, and that also includes an ion energy selector configured to enable the ion angle detector to also function as an ion energy detector in accordance with embodiments of the invention. The ion angle detector of FIG. 2 may be a specific implementation of other ion angle detectors described herein such as the ion angle detector of FIG. 1, for example. Similarly labeled elements may be as previously described.

Referring to FIG. 2, an ion angle detector 200 includes a front plate 220 with an aperture 222 configured to produce an ion beam 212 from ions 211. An ion collector 230 is positioned on the back side of the front plate 220 and is mechanically coupled to a parallel linear actuator 240 configured to move the ion collector 230 in a parallel direction 241 relative to the ion beam 212 (compared to a perpendicular direction 251 relative to the ion beam 212). It should be noted that here and in the following a convention has been adopted for brevity and clarity wherein elements adhering to the pattern [x30] where 'x' is the figure number may be related implementations of an ion collector in various embodiments. For example, the ion collector 230 may be similar to the ion collector 130 except as otherwise stated. An analogous convention has also been adopted for other elements as made clear by the use of similar terms in conjunction with the aforementioned numbering system.

The ion angle detector 200 may be a specific implementation of and therefore be similar to the ion angle detector 100 except that the ion angle detector 200 is also an ion energy detector and so includes at least one ion energy selector (e.g., a structure configured to generate a field, such as a plate, grid, etc.) configured to select the energy (or range of energies) of the ions reaching the ion collector 230. For instance, the ion energy selector may be coupled to a controllable voltage that repels ions below a certain (selected) energy threshold resulting in ion at or above the energy threshold to be selected for detection by the ion collector 230.

The configuration and location of the ion energy selector may vary. Some possible positions are shown: an optional front ion energy selector 224, an optional back ion energy selector 225, and an optional collector ion energy selector 226. An ion energy selector may be included in one, some or all of these positions of the ion angle detector 200. In various embodiments, the ion angle detector 200 includes the optional front ion energy selector 224, and the optional front ion energy selector 224 is implemented as a conductive plate in one embodiment. In some embodiments, the ion angle detector 200 includes the optional collector ion energy selector 226, and the optional collector ion energy selector 226 is implemented as a discriminator grid in one embodiment. Notably, when a discriminator grid is included as an ion energy selector, the discriminator grid configured to avoid influencing ion angle (e.g., the discriminator grid may be made thin and openings may be configured to avoid ion scattering).

The ion angle detector 200 may be operated in multiple modes, which may be switched between at any desired time. For example, in an angle detection mode, the ion angle detector 200 may disable the ion energy selector and measure ion flux with respect to ion energy. In an energy detection mode, the ion energy selector may be enabled and the ion angle detector 200 may measure ion flux with respect to ion energy. Additionally, since the ion collector 230 can be moved to different locations and used in either or both modes at each location, the ion flux at various ion energies can also be related to ion angle and to the spatial location in the ion beam 212.

Figure 3:
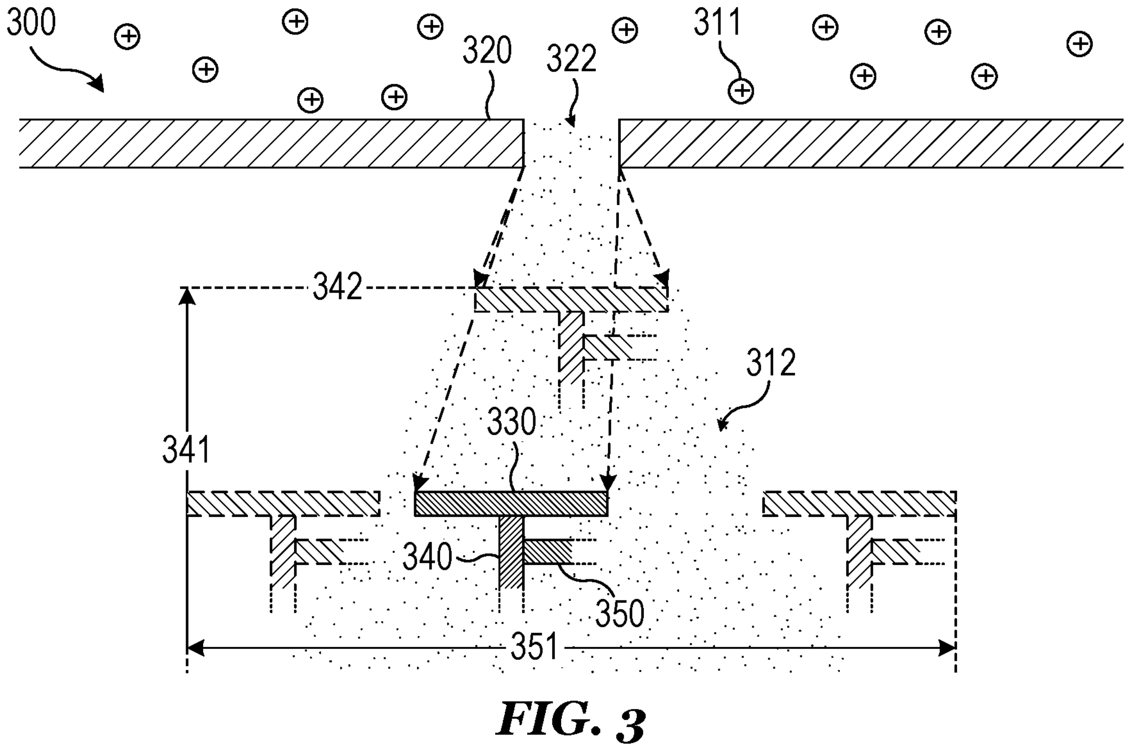
FIG. 3 illustrates an example ion angle detector that includes a linear actuator configured to move an ion collector in a direction parallel to an ion beam, and that also includes another linear actuator configured to move the ion collector in a direction perpendicular to the ion beam in accordance with embodiments of the invention.

FIG. 3 illustrates an example ion angle detector that includes a linear actuator configured to move an ion collector in a direction parallel to an ion beam, and that also includes another linear actuator configured to move the ion collector in a direction perpendicular to the ion beam in accordance with embodiments of the invention. The ion angle detector of FIG. 3 may be a specific implementation of other ion angle detectors described herein such as the ion angle detector of FIG. 1, for example. Similarly labeled elements may be as previously described.

Referring to FIG. 3, an ion angle detector 300 includes a front plate 320 with an aperture 322 configured to produce an ion beam 312 from ions 311. An ion collector 330 is positioned on the back side of the front plate 320 and is mechanically coupled to a parallel linear actuator 340 configured to move the ion collector 330 in a parallel direction 341 relative to the ion beam 312 (compared to a perpendicular direction 351 relative to the ion beam 312). The ion angle detector 300 may be a specific implementation of and therefore be similar to the ion angle detector 100 except that the ion angle detector 300 also includes a perpendicular linear actuator 350 (perpendicular in the sense that the perpendicular linear actuator 350 is configured to move the ion collector 330 in the perpendicular direction 351). Similar to the previous discussion of the parallel direction, the net angle of the ions in the ion beam 312 may not be perfectly along the axis of the aperture 322 (or neutral) and the perpendicular motion of the perpendicular linear actuator 350 may not be exactly perpendicular to the ion beam 312 (instead being substantially perpendicular, having the dominant component being perpendicular to the ion beam 312, for example).

Advantageously, the ability to move the ion collector 330 in the perpendicular direction 351 may allow ion flux to be detected by the ion collector 330 in off-axis (the axis of the aperture 322, for example). This allows additional spatial resolution for all obtainable quantities related to ion angle (and ion energy when the ion angle detector 300 is also configured as an ion energy detector).

One possible use of the capability of the ion angle detector 300 to move in the perpendicular direction 351 is to allow the ion collector 330 to be centered on the ion beam 312 (at a given distance from the aperture 322) to adjust to situations where the ion beam 312 and the ion collector 330 are not sufficiently aligned. This may occur for a variety of reasons including when the ion beam 312 has a net off-axis directionality and also when the ion collector 330 is not precisely aligned with the aperture. One implementation may be to move the ion collector 330 along the perpendicular direction 351 at a minimum parallel distance 342 to find the position of maximum ion flux (e.g., indicating the center of the beam, or at least a local maximum). The ion collector 330 can then be moved along the perpendicular direction 351 to position of maximum ion flux. This may, for example, be performed as a preliminary calibration, or as the first centering step in a series of centering steps at one or more additional distances from the aperture 322.

The ability to move the ion collector 330 off-axis also may advantageously enable various additional ion angle (and optionally ion energy) measurements. For example, the diameter of the ion beam 312 and/or the beam divergence of the ion beam 312 can be determined using maximum flux value measured at the minimum parallel distance, the ion flux measured at various distances, the diameter of the aperture 322. Specifically, the beam divergence may be obtained using $f_{max}/f_n=D^2/w^2$ where $f_{max}$ is the ion flux close to aperture (e.g., the maximum ion flux measurable by the ion angle detector 300), $f_n$ is the ion flux at the nth measurement distance, w is the diameter of the aperture, and D is the diameter of the ion beam. The beam divergence angle ($\theta_{beam}$) can then be determined by $\theta_{beam}=\tan^{-1}(D/2d)$ (e.g., assuming that w is negligible with respect to D, otherwise, $\theta=\tan^{-1}((D-w)/2d)$.

Figure 4A:
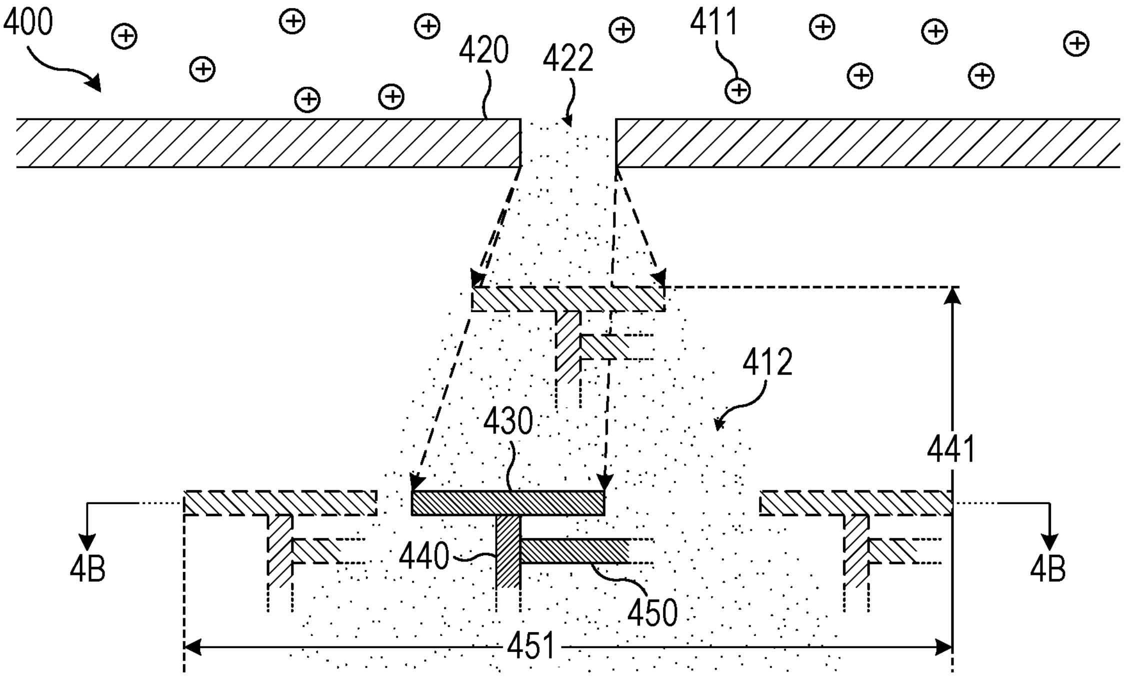
FIGS. 4A and 4B illustrate an example ion angle detector that includes three linear actuators configured to move an ion collector in a direction parallel to an ion beam and two directions perpendicular to the ion beam where
Figure 4B:
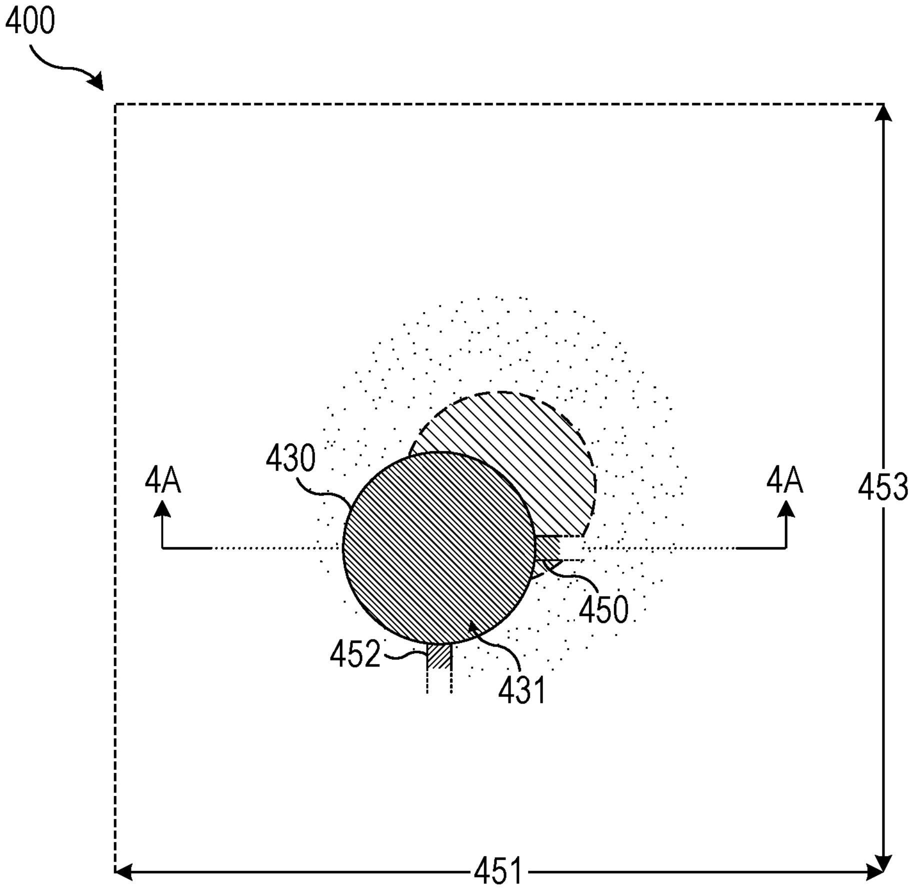

FIGS. 4A and 4B illustrate an example ion angle detector that includes three linear actuators configured to move an ion collector in a direction parallel to an ion beam and two directions perpendicular to the ion beam where FIG. 4A shows a side view of the ion angle detector and FIG. 4B shows an overhead view of the ion angle detector in accordance with embodiments of the invention. The ion angle detector of FIGS. 4A and 4B may be a specific implementation of other ion angle detectors described herein such as the ion angle detector of FIG. 1, for example. Similarly labeled elements may be as previously described.

Referring to FIGS. 4A and 4B, an ion angle detector 400 includes a front plate 420 with an aperture 422 configured to produce an ion beam 412 from ions 411. An ion collector 430 is positioned on the back side of the front plate 420 and is mechanically coupled both to a parallel linear actuator 440 configured to move the ion collector 430 in a parallel direction 441 relative to the ion beam 412 and to a perpendicular linear actuator 450 configured to move the ion collector 430 in a perpendicular direction 451 relative to the ion beam 412. The ion angle detector 400 may be a specific implementation of and therefore be similar to the ion angle detector 300 except that the ion angle detector 400 also includes a second perpendicular linear actuator 452 configured to move the ion collector 430 in a second perpendicular direction 453.

The ion angle detector 400 expands the off-axis detection capabilities to allow a collection area 431 of the ion collector 430 to be moved to all off-axis locations in each plane defined by the distance from the aperture 422. It should be noted that although using three linear actuators (e.g., substantially orthogonal to one another) allows complete detection coverage in a three-dimensional volume, other configurations may be utilized to achieve the same or similar functionality. For example, the second perpendicular linear actuator 452 may be replaced with an arm configured to sweep out an angle about a pivot point at a peripheral location relative to the path of the ion beam 312. The perpendicular linear actuator 450 may then be operated in tandem with the arm to achieve the same or similar planar detection coverage.

Further, the desired motion may also be achieved in a number of other ways. Thus, the individual capabilities of the various actuators that may be included in the embodiment ion angle detectors described herein are not intended to be limiting. Rather, the embodiment ion angle detectors are configured to move the ion collector in a parallel direction relative to the ion beam and optionally in one or more perpendicular directions, the specific actuator configurations merely being example configurations.

Figure 5:
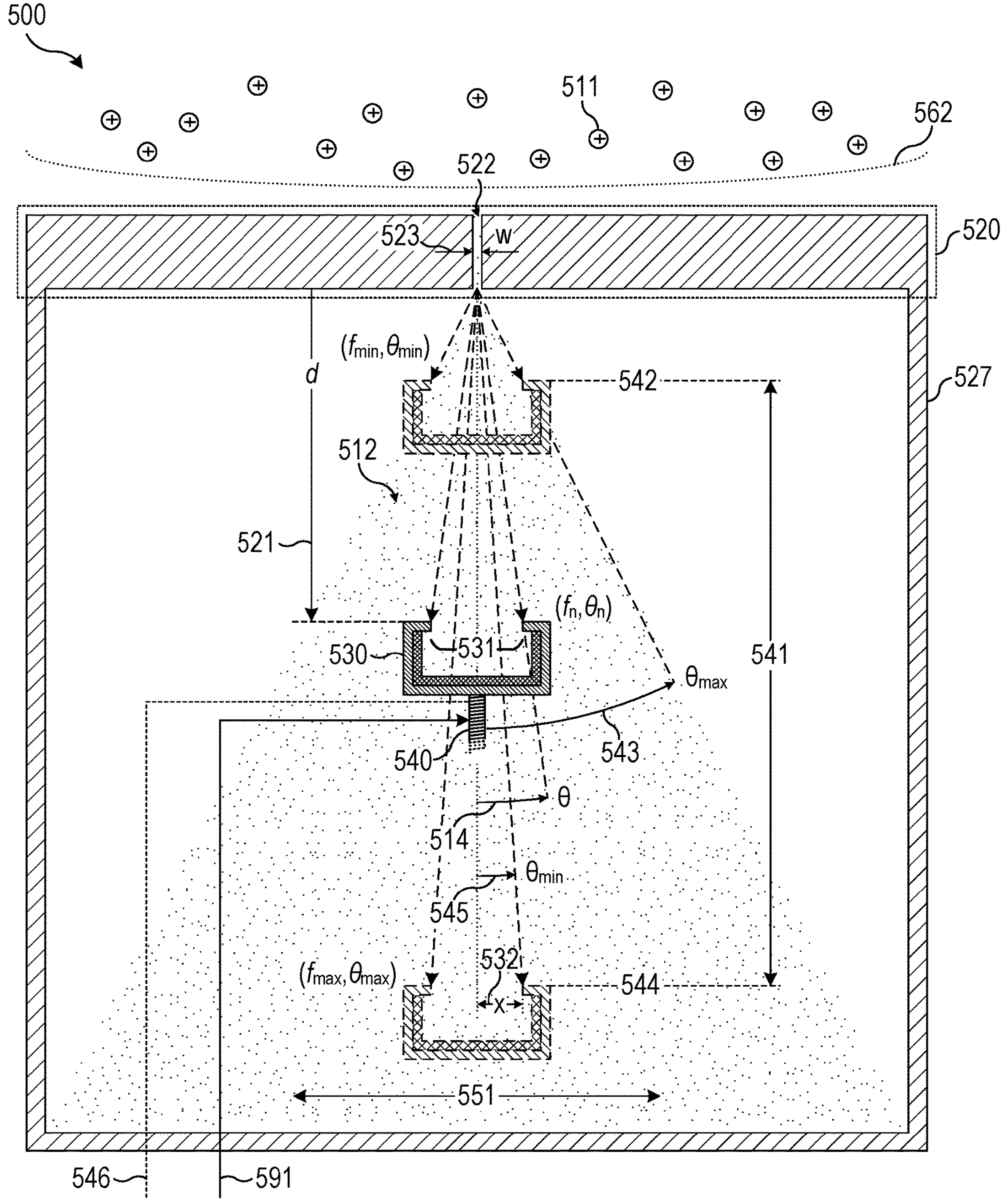
FIG. 5 illustrates an example ion angle detector that includes a linear drive configured to move a Faraday cup within an enclosure in a direction parallel to an ion beam produced by an aperture in a front plate of the enclosure in accordance with embodiments of the invention.

FIG. 5 illustrates an example ion angle detector that includes a linear drive configured to move a Faraday cup within an enclosure in a direction parallel to an ion beam produced by an aperture in a front plate of the enclosure in accordance with embodiments of the invention. The ion angle detector of FIG. 5 may be a specific implementation of other ion angle detectors described herein such as the ion angle detector of FIG. 1, for example. Similarly labeled elements may be as previously described.

Referring to FIG. 5, an ion angle detector 500 includes a front plate 520 with an aperture 522 having an aperture diameter 523 configured to produce an ion beam 512 from ions 511 of a plasma 562. In this specific example, the front plate 520 is part of an enclosure 527 which may be configured to isolate the ion beam 512 from external effects such as the plasma 562 and various fields. A Faraday cup 530 is positioned inside the enclosure 527 and is mechanically coupled to a parallel linear drive 540. The parallel linear drive 540 may be controlled using a parallel signal 546 and receive power from drive power 591. The parallel linear drive 540 is configured to move the Faraday cup 530 from a minimum parallel distance 542 to a maximum parallel distance 544 along a parallel direction 541 relative to the ion beam 512 (and in contrast to moving laterally relative to the beam, as in a perpendicular direction 551).

At a given distance 521 (denoted as d) from the aperture 522, a fraction of the ion beam 512 (which may be the entire beam) enters a collection area 531 of the Faraday cup 530. The Faraday cup 530 is configured to transduce the number of ions 511 that arrive at the collection area 531 (i.e., the ion flux) into a usable signal, such as electric current. The fraction of the ion beam 512 entering the collection area 531 is the measured ion angle 514 (i.e., a solid angle θ of the ion beam 512). Due to the relative positioning of the aperture 522 and the Faraday cup 530, the ion angle 514 is at a maximum angle 543 ($\theta_{max}$) when the Faraday cup 530 is at the minimum parallel distance 542 and is at a minimum angle 545 ($\theta_{min}$) when the Faraday cup 530 is at the maximum parallel distance 544.

Figure 6:
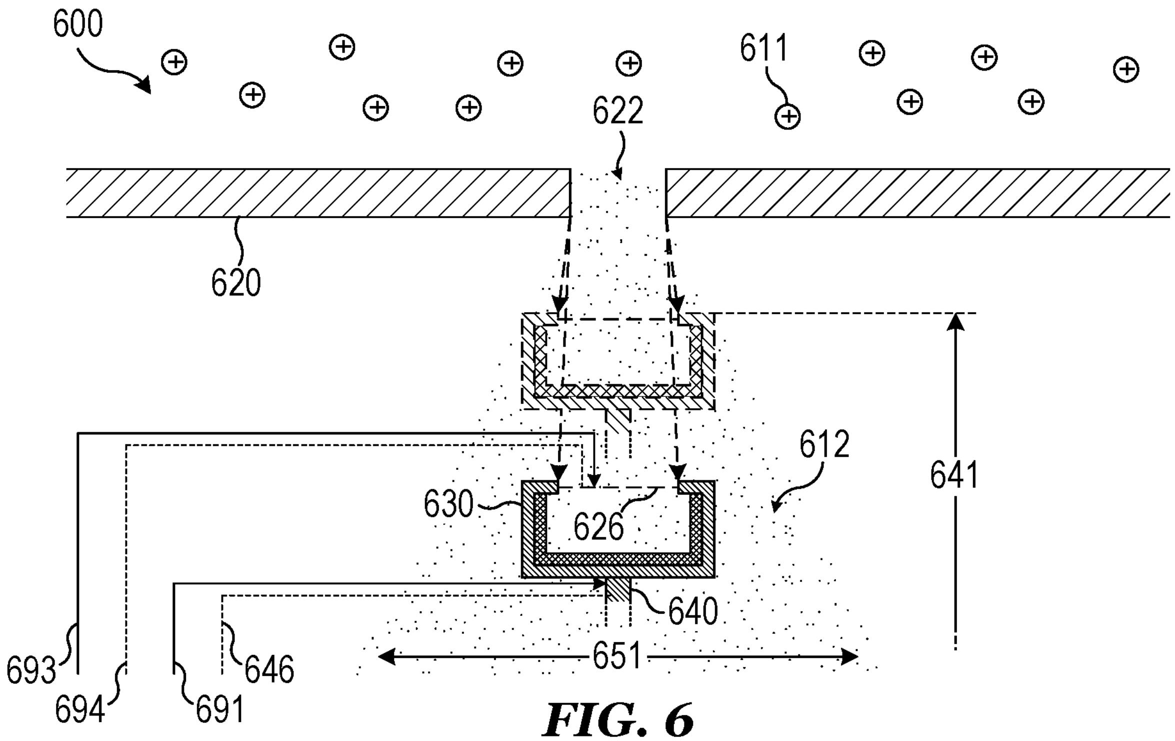
FIG. 6 illustrates an example ion angle detector that includes a linear actuator configured to move a Faraday cup in a direction parallel to an ion beam, and that also includes a thin repeller grid configured to enable the ion angle detector to also function as an ion energy detector in accordance with embodiments of the invention.

FIG. 6 illustrates an example ion angle detector that includes a linear actuator configured to move a Faraday cup in a direction parallel to an ion beam, and that also includes a thin repeller grid configured to enable the ion angle detector to also function as an ion energy detector in accordance with embodiments of the invention. The ion angle detector of FIG. 6 may be a specific implementation of other ion angle detectors described herein such as the ion angle detector of FIG. 2, for example. Similarly labeled elements may be as previously described.

Referring to FIG. 6, an ion angle detector 600 includes a front plate 620 with an aperture 622 configured to produce an ion beam 612 from ions 611. A Faraday cup 630 is positioned on the back side of the front plate 620 and is mechanically coupled to a parallel linear actuator 640 configured to move the Faraday cup 630 in a parallel direction 641 relative to the ion beam 612 (compared to a perpendicular direction 651 relative to the ion beam 612). The parallel linear actuator 640 may be controlled using a parallel signal 646 and receive power from actuator power 691.

The ion angle detector 600 may be a specific implementation of and therefore be similar to the ion angle detector 500 except that the ion angle detector 600 is also an ion energy detector. In this specific example, a thin discriminator grid 626 is included with the Faraday cup 630. The thin discriminator grid 626 is configured to enable selection an ion energy or ion energy range that enters the collection area. Further, the thin discriminator grid 626 is also configured to avoid influencing the ion angle of the ion beam 612 (e.g., when operating in angle detection mode). The thin discriminator grid 626 may be affixed at the opening (i.e., the collection area) of the Faraday cup 630 or may be included inside our outside, such as over, the Faraday cup 630). Of course, additional grids may also be included, such as electron repeller grids, additional discriminator grids, and others (although no thick, high aspect ratio microchannel grid is included because it is not necessary for angular discrimination). Additional control and power may be used for the thin discriminator grid 626. For example, the thin discriminator grid 626 may be controlled using an energy selection signal 694 and receive power from energy selection power 693.

Figure 7:
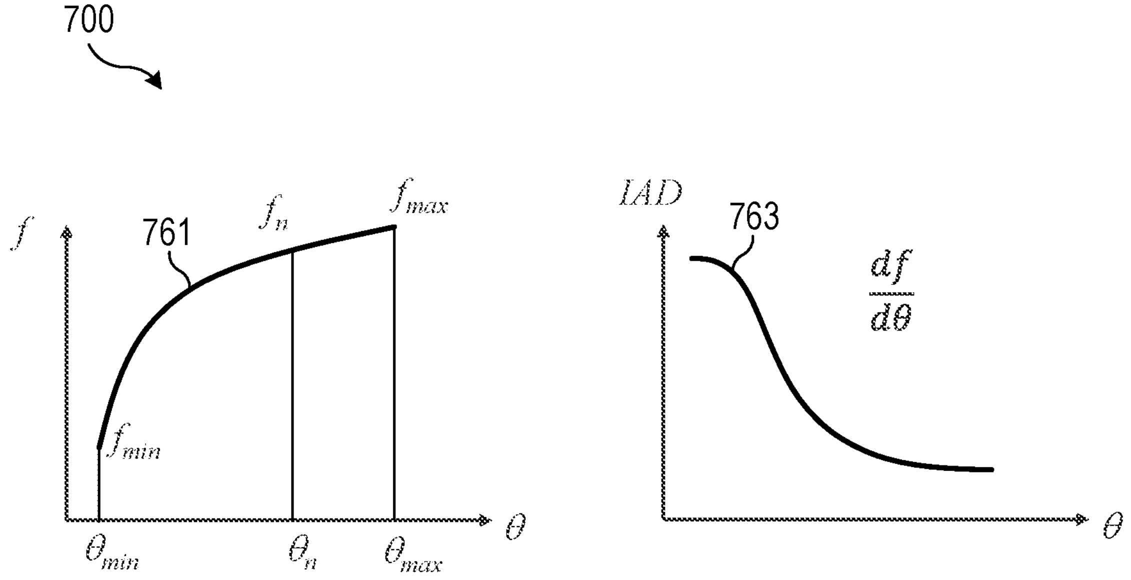
FIG. 7 illustrates qualitative graphs of ion flux and ion angular distribution versus ion angle analogous to ion flux and ion angular distribution which may be detected by the ion angle detectors in accordance with embodiments of the invention.

FIG. 7 illustrates qualitative graphs of ion flux and ion angular distribution versus ion angle analogous to ion flux and ion angular distribution which may be detected by the ion angle detectors in accordance with embodiments of the invention. For example, the qualitative graphs of FIG. 7 may be analogous to ion flux and ion angular distribution that may be detected by any of the ion angle detectors of FIGS. 1-6.

Referring to FIG. 7, qualitative graphs 700 include a qualitative graph of ion flux 761 versus measured ion angle and a qualitative graph of IAD 763 versus measure ion angle. As previously discussed, the measured ion angle is related to the distance from the source location of the ion beam (e.g., an aperture) which is modulated by moving an ion collector in a direction parallel to the ion beam. As the ion angle becomes larger more ions are detected (higher ion flux at the collection area because a larger solid angle of the ion beam is detected). The corresponding IAD may then be determined by taking the derivative of the ion flux with respect to the ion angle, resulting in a corresponding IAD curve.

Figure 8:
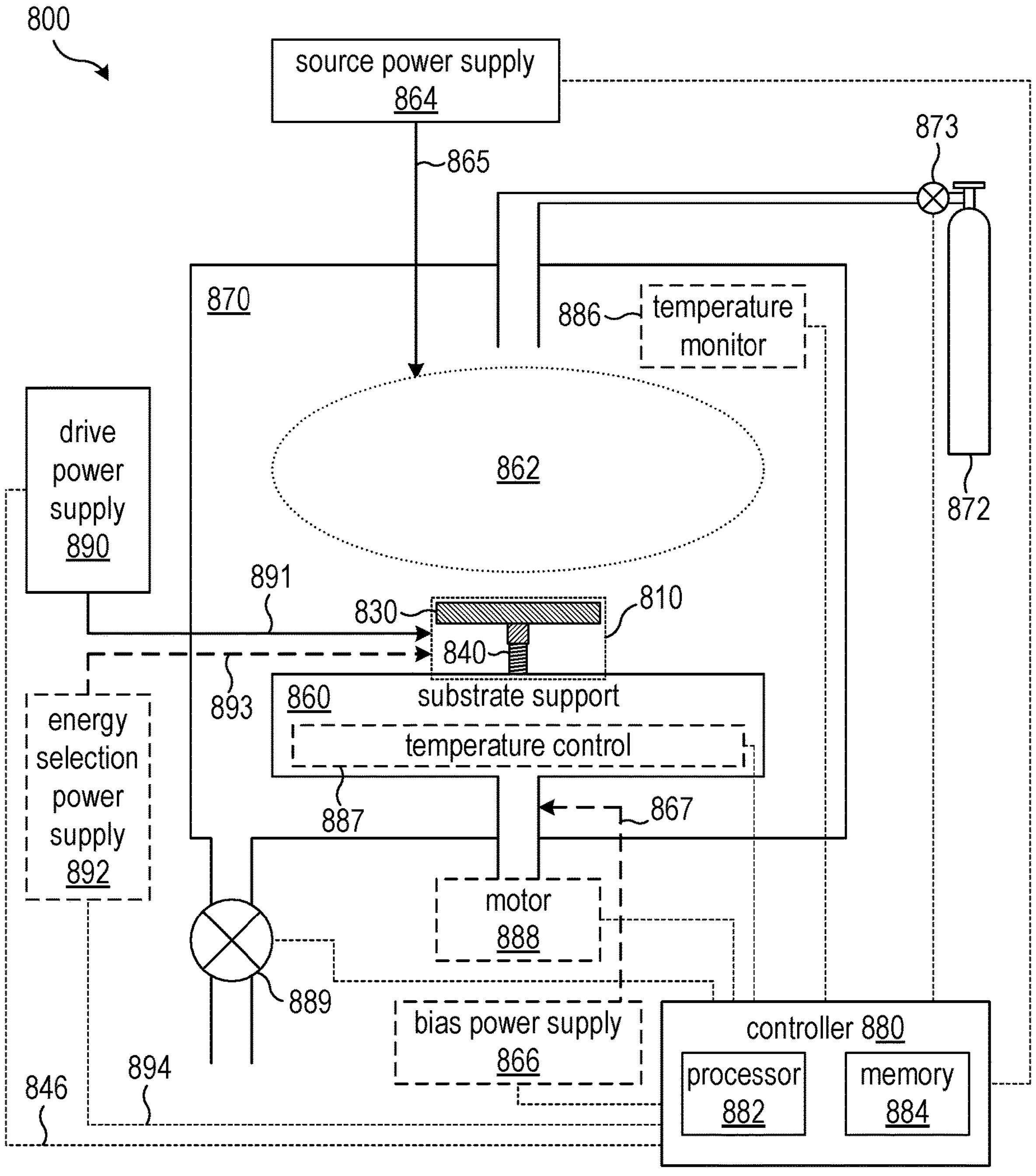
FIG. 8 illustrates an example plasma system that includes an ion angle detector and may be used to perform methods of measuring ion angular distribution in accordance with embodiments of the invention.
Figure 9:
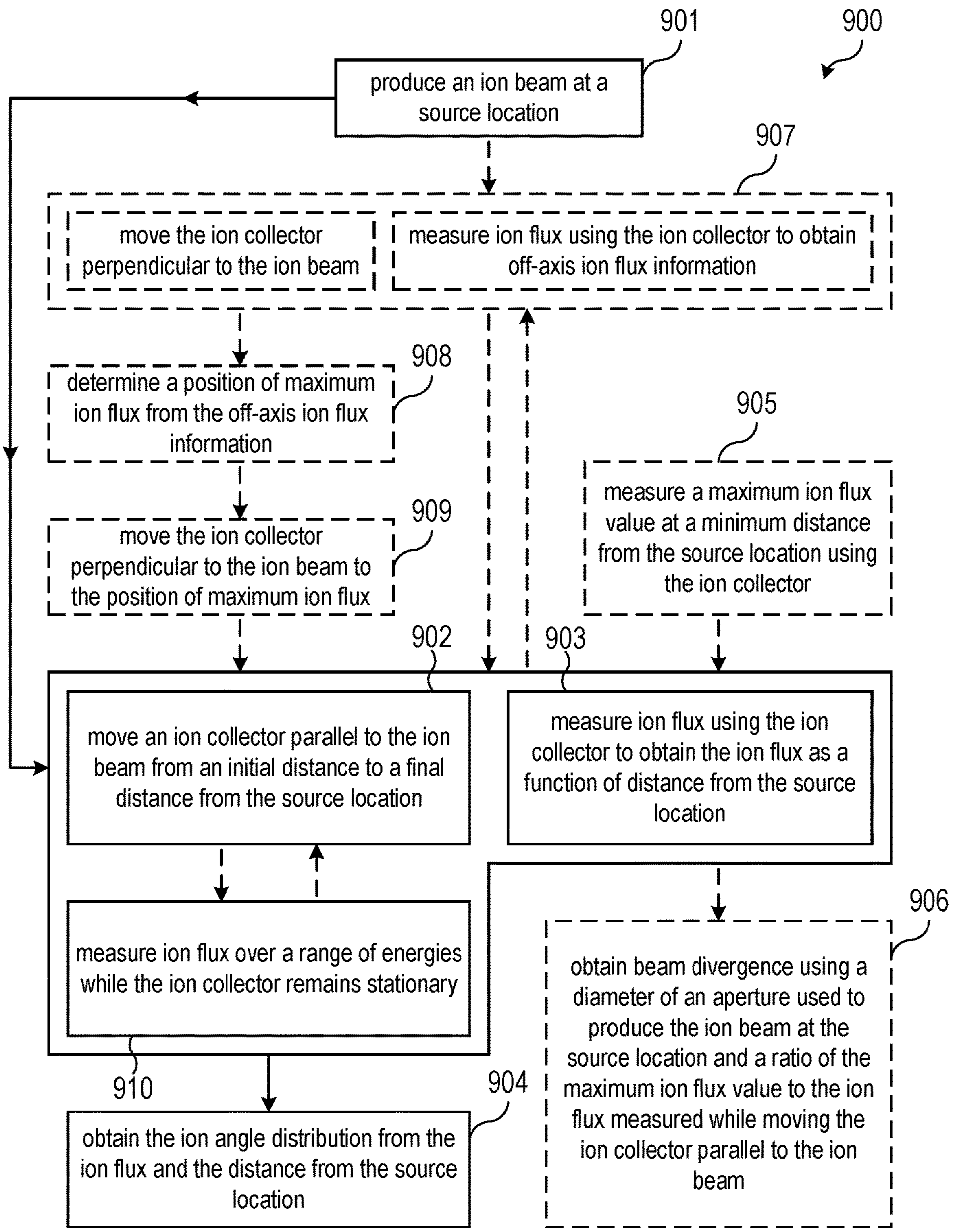
FIG. 9 illustrates an example method of measuring ion angular distribution in accordance with embodiments of the invention.

FIG. 8 illustrates an example plasma system that includes an ion angle detector and may be used to perform methods of measuring ion angular distribution in accordance with embodiments of the invention. For example, the plasma system of FIG. 8 may include any of the ion angle detectors of FIGS. 1-6 and be used to perform the various implementations of the method of FIG. 9. Similarly labeled elements may be as previously described.

Referring to FIG. 8, a plasma system 800 includes an ion angle detector 810 disposed within a chamber 870. The ion angle detector 810 has an ion collector 830 mechanically coupled to a parallel linear drive 840. The parallel linear drive 840 is configured to move the ion collector 830 in a direction parallel to an ion beam produced from a plasma 862 generated within the chamber 870. The plasma system 800 may also include a support 860 disposed within the chamber 870 (e.g., configured to support a substrate, such as a processing wafer or test substrate, or specifically configured to support the ion angle detector 810.

A process gas source 872 (e.g., an etchant gas, precursor gas, etc.) is fluidically coupled to the chamber 870 through one or more valves 873. Additional gas sources and valves may also be included in the plasma system 800. For example, a gas source or sources including additional gases may be included, such as carrier gases, additional reactants and precursors, stabilizers, catalysts and others) may be fluidically coupled to the chamber 870 one or more valves. An exhaust valve 889 is also included to evacuate the chamber 870 during the processes performed therein, such as etching processes, deposition processes, and others as well as during any test processes used to measure plasma parameters such as IAD.

The chamber 870 may be any suitable chamber capable of containing the plasma 862, such as a plasma etch chamber (e.g., a capacitively coupled plasma (CCP) etch chamber, an inductively coupled plasma (ICP) etch chamber, etc.), a plasma deposition chamber (e.g., a plasma-enhanced chemical vapor deposition (PE-CVD) chamber, a plasma-enhanced atomic layer deposition (PE-ALD) chamber, etc.), and others. The chamber 870 may also be a test chamber used for testing plasma properties (e.g., to determine desirable parameters for a given plasma process). When the chamber 870 is a test chamber, the chamber 870 may have some degree of similarity to chambers used for processing, such as to obtain relevant plasma measurements. In other embodiments, the chamber 870 is a processing chamber, such as an etch chamber, a deposition chamber, or a multipurpose chamber. The support 860 may then be used to support the ion angle detector 810 during testing and one or more substrates during processing.

Alternatively, a specialized support may be used for the ion angle detector 810 and a different support may be used to support one or more substrates during processing. Further, the ion angle detector 810 may be included in the chamber 870 in a separate capacity from the support 860 and a substrate being processed so that measurements may be made in situ during a plasma process, whether during process steps or between process steps, continuously or at desired moments of the plasma process.

The plasma system 800 is configured to generate the plasma 862 using a source power supply 864 configured to couple source power 865 to gases in the chamber 870 (e.g., the process gas from the process gas source 872 and any other gases included in the chamber 870). A bias power supply 866 may also be included that is configured to supply bias power 867 to the support 860, such as to accelerate ions in the plasma 862 towards a supported substrate (or the ion angle detector 810), for example.

An optional temperature monitor 886 may also be included to monitor and/or aid in controlling the temperature of a substrate and the environment in the chamber 870. An optional temperature control device 887 (heater, cooler, or combination thereof) may be included to elevate or reduce the temperature of the substrate above/below the equilibrium temperature at the substrate during process steps (although some process steps may be performed at ambient temperatures even when the optional temperature control device 887 is included). An optional motor 888 may also be included to improve process (e.g., etch/deposition) uniformity.

A drive power supply 890 is configured to supply the ion angle detector 810 with drive power 891 for the parallel linear drive 840. An energy selection power supply 892 may also be included (i.e., when the ion angle detector 810 is also an ion energy detector) and is configured to supply the ion angle detector 810 with energy selection power 893 to controllably filter out lower energy ions when functioning as an ion energy detector. A controller 880 (or a control system including multiple specialized controllers that may also be considered the controller 880) is operatively coupled to the drive power supply 890, the one or more valves 873, and the source power supply 864, and may be operatively coupled to any of the energy selection power supply 892, the bias power supply 866, the optional temperature monitor 886, the optional temperature control device 887, the optional motor 888, and the exhaust valve 889. For example, the plasma system 800 may be configured to control the drive power supply 890 using a parallel signal 846 and (when included) configured to control the energy selection power supply 892 using an energy selection signal 894.

The controller 880 includes a processor 882 and a memory 884 (i.e., a non-transitory computer-readable medium) that stores a program including instructions that, when executed by the processor 882, perform methods of measuring the IAD of a plasma (such as a plasma substantially the same as or similar that used for a plasma process, such as an etching process, a deposition process, etc.). For example, the memory 884 may have volatile memory (e.g., random access memory (RAM)) and non-volatile memory (e.g., flash memory). Alternatively, the program may be stored in physical memory at a remote location, such as in cloud storage. The processor 882 may be any suitable processor, such as the processor of a microcontroller, a general-purpose processor (such as a central processing unit (CPU), a microprocessor, a field-programmable gate array (FPGA), an application-specific integrated circuit (ASIC), and others.

FIG. 9 illustrates an example method of measuring IAD in accordance with embodiments of the invention. The method of FIG. 9 may be combined with other methods and performed using the systems and apparatuses as described herein. For example, the method of FIG. 9 may be combined with any of the embodiments of FIGS. 1-8. Although shown in a logical order, the arrangement and numbering of the steps of FIG. 9 are not intended to be limited. The method steps of FIG. 9 may be performed in any suitable order or concurrently with one another as may be apparent to a person of skill in the art.

Referring to FIG. 9, a method 900 of measuring ion angular distribution includes a step 901 of producing an ion beam at a source location. The ion beam may be produced by any suitable method, one example of which is using an aperture in a front plate (e.g., from a plasma incident on the front plate). An ion collector is moved parallel to the ion beam in a step 901 from an initial distance from the source location to a final distance from the source location. Of course, the ion collector may be moved in any pattern between the initial and final distance, such as returning back to the initial distance or even moving back and forth between intermediate distances between the initial distance and the final distance, if desired.

While moving the ion collector in the parallel direction, ion flux from the ion beam is measured in a step 903 using the ion collector to obtain the ion flux as a function of distance from the source location (e.g., an aperture). In a step 904, the IAD is obtained from the ion flux and the distance from the distance from the source location. For example, the measured ion angle may be obtained as a function of the distance from the source location using a constant collection radius of the ion collector and then the IAD may be obtained using the ion flux and the measured ion angle (such as by taking the derivative of the ion flux with respect to the measured ion angle, or by calculating the IAD at each measurement point by dividing the change in measured ion flux by the annular collection area corresponding to the change in measured ion angle).

The beam divergence of the ion beam may also be determined during the method 900. For example, in a step 905, a maximum ion flux value may be measured using the ion collector (corresponding to a minimum distance from the source location). In one embodiment, the initial distance of the ion collector from the source location is the minimum distance and step 905 is performed just before step 902 and step 903 are performed. Alternatively, the final distance may be the minimum distance or the ion collector may be moved to the minimum distance at any point during step 902. The maximum ion flux may be measured during step 905 any time that the ion collector is moved to the minimum distance. After measuring the maximum ion flux in step 905 and obtaining the ion flux as a function of the distance from the source location in step 903, the beam divergence may be obtained in a step 906 using a diameter of an aperture used to produce the ion beam at the source location and a ratio of the maximum ion flux value to the ion flux measured in step 903.

At any point during the step 902 (as well as before or after the ion collector is moved), the ion collector may be held stationary and ion energy measurements may be made. Specifically, the ion flux from the ion beam may be measured during a step 910 over a range of energies (e.g., using an ion energy selector, such as a discriminator grid) while the ion collector remains stationary at some distance from the source location (i.e. a distance that the collector is at during the method 900 in the inclusive range from the initial distance to the final distance). The ion flux measurements during step 910 may be used to obtain the ion flux as a function of ion energy for a given distance and then to obtain a distance-dependent IED (ion energy distribution), such as by taking the derivative of the ion flux with respect to the ion energy.

The ion collector may also be moved in a direction perpendicular to the ion beam during various stages of the method 900. For example, prior to step 902 and step 903, the ion collector may be moved in a direction perpendicular to the ion beam in a step 907, and the ion flux may be measured using the ion collector while moving the ion collector perpendicular to the ion beam to obtain off-axis ion flux information. The off-axis information may be used in various ways, such as to determine a position of maximum ion flux in a step 908. The ion collector can then be moved (i.e., perpendicular to the ion beam) to the position of maximum ion flux in a step 909. For example, this may allow the ion collector to be centered on the ion beam at the initial distance (or potentially at any distance that the ion collector is moved to during step 902).

Of course, the off-axis information acquirable in step 907 may also be used in other ways, such as to more completely characterize the ion beam (and hence the plasma). That is, one or both perpendicular dimensions may be leveraged to obtain ion flux measurements at various off-axis locations (and thus include ion flux information of various solid angle slices of the ion beam) within the plane of any of the distances that the ion collector is moved to during step 902. The possible implementations range from sampling specific off-axis locations in one perpendicular dimension at one or a few distances from the source location to raster measurements covering the entire range of the ion collector in two perpendicular dimensions at each distance from the source location.

Example embodiments of the invention are summarized here. Other embodiments can also be understood from the entirety of the specification as well as the claims filed herein.

Example 1. An ion angle detector including: a front plate including an aperture configured to form an ion beam from incident ions; an ion collector configured to measure ion flux from the ion beam; and a first linear actuator mechanically coupled to the ion collector and configured to move the ion collector in a direction parallel to the ion beam.

Example 2. The ion angle detector of example 1, further including: a second linear actuator mechanically coupled to the ion collector and configured to move the ion collector in a direction perpendicular to the ion beam.

Example 3. The ion angle detector of one of examples 1 and 2, where: the ion collector includes a collection area having a constant collection radius; the first linear actuator is configured to move the ion collector to a maximum distance from the front plate; and the ion angle detector is configured to measure the ion flux from the ion beam at a minimum angle defined by the inverse tangent of a ratio of the constant collection radius to the maximum distance.

Example 4. The ion angle detector of example 3, where: the first linear actuator is configured to move the ion collector to a minimum distance from the front plate; the first linear actuator is configured to move the ion collector with a maximum linear resolution; and the ion angle detector is configured to measure the ion flux from the ion beam with an angular resolution higher than about 1° defined by the constant collection radius, the minimum distance, and the maximum linear resolution.

Example 5. The ion angle detector of one of examples 1 to 4, further including: an ion energy selector configured to prevent ions from the ion beam with energies below a selected energy threshold from reaching the ion collector, the ion angle detector also being an ion energy detector.

Example 6. The ion angle detector of one of examples 1 to 4, where the ion angle detector is grid-less, the ion beam traveling unobstructed from the aperture to the ion collector, and the front plate being configured to be in direct contact with a plasma including the ions.

Example 7. A method of measuring ion angular distribution of a plasma, the method including: producing an ion beam from the plasma at a source location; moving an ion collector parallel to the ion beam from an initial distance from the source location to a final distance from the source location; measuring ion flux from the ion beam using the ion collector while moving the ion collector parallel to the ion beam to obtain the ion flux as a function of distance from the source location; and obtaining the ion angular distribution from the ion flux and the distance from the source location.

Example 8. The method of example 7, further including: obtaining measured ion angle as a function of the distance from the source location using a constant collection radius of the ion collector, where the ion angular distribution is obtained using the ion flux and the measured ion angle.

Example 9. The method of example 8, where obtaining the ion angular distribution includes taking the derivative of the ion flux with respect to the measured ion angle.

Example 10. The method of one of examples 7 to 9, further including: measuring a maximum ion flux value at the initial distance from the source location using the ion collector, the ion beam being produced by an aperture at the source location; and obtaining beam divergence using a diameter of the aperture and a ratio of the maximum ion flux value to the ion flux measured while moving the ion collector parallel to the ion beam.

Example 11. The method of one of examples 7 to 10, further including: moving the ion collector perpendicular to the ion beam; and measuring the ion flux using the ion collector while moving the ion collector perpendicular to the ion beam to obtain off-axis ion flux information.

Example 12. The method of example 11, further including: determining a position of maximum ion flux from the off-axis ion flux information; and moving the ion collector perpendicular to the ion beam to the position of maximum ion flux.

Example 13. The method of one of examples 7 to 12, further including: measuring the ion flux from the ion beam over a range of ion energies while the ion collector remains stationary at each of one or more distances in the inclusive range from the initial distance to the final distance.

Example 14. A plasma system including: a chamber configured to contain a plasma; an ion angle detector disposed within the chamber, the ion angle detector including a front plate including an aperture configured to form an ion beam from the plasma, an ion collector configured to measure ion flux from the ion beam, and a first linear actuator mechanically coupled to the ion collector and configured to move the ion collector in a direction parallel to the ion beam; and a controller operatively coupled to the ion angle detector, the controller including a processor and a non-transitory computer-readable medium storing a program including instructions that, when executed by the processor, perform a method of measuring ion angular distribution of the plasma, the method including moving the ion collector parallel to the ion beam from an initial distance from the aperture to a final distance from the aperture using the first linear actuator, measuring ion flux from the ion beam using the ion collector while moving the ion collector parallel to the ion beam to obtain the ion flux as a function of distance from the aperture, and obtaining the ion angular distribution from the ion flux and the distance from the aperture.

Example 15. The plasma system of example 14, where the method further includes obtaining measured ion angle as a function of the distance from the aperture using a constant collection radius of the ion collector, and where obtaining the ion angular distribution includes taking the derivative of the ion flux with respect to the measured ion angle.

Example 16. The plasma system of one of examples 14 and 15, where the ion angle detector further includes a second linear actuator mechanically coupled to the ion collector, and where the method further includes moving the ion collector perpendicular to the ion beam, and measuring the ion flux using the ion collector while moving the ion collector perpendicular to the ion beam to obtain off-axis ion flux information.

Example 17. The plasma system of example 16, where the method further includes determining a position of maximum ion flux from the off-axis ion flux information, and moving the ion collector to the position of maximum ion flux.

Example 18. The plasma system of one of examples 14 to 17, where the ion collector is a Faraday cup.

Example 19. The plasma system of one of examples 14 to 18, where the ion angle detector further includes an ion energy selector configured to prevent ions from the ion beam with energies below a selected energy threshold from reaching the ion collector, the ion angle detector also being an ion energy detector.

Example 20. The plasma system of one of examples 14 to 18, where the ion angle detector is grid-less, the ion beam traveling unobstructed from the aperture to the ion collector, and the front plate being in direct contact with the plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An ion angle detector comprising:

a front plate comprising an aperture configured to form an ion beam from incident ions;

an ion collector configured to measure ion flux from the ion beam; and a first linear actuator mechanically coupled to the ion collector and configured to move the ion collector in a direction parallel to the ion beam.

2. The ion angle detector of claim 1, further comprising:

a second linear actuator mechanically coupled to the ion collector and configured to move the ion collector in a direction perpendicular to the ion beam.

3. The ion angle detector of claim 1, wherein:

the ion collector comprises a collection area having a constant collection radius;

the first linear actuator is configured to move the ion collector to a maximum distance from the front plate; and the ion angle detector is configured to measure the ion flux from the ion beam at a minimum angle defined by the inverse tangent of a ratio of the constant collection radius to the maximum distance.

4. The ion angle detector of claim 3, wherein:

the first linear actuator is configured to move the ion collector to a minimum distance from the front plate;

the first linear actuator is configured to move the ion collector with a maximum linear resolution; and the ion angle detector is configured to measure the ion flux from the ion beam with an angular resolution higher than about 1° defined by the constant collection radius, the minimum distance, and the maximum linear resolution.

5. The ion angle detector of claim 1, further comprising: an ion energy selector configured to prevent ions from the ion beam with energies below a selected energy threshold from reaching the ion collector, the ion angle detector also being an ion energy detector.

6. The ion angle detector of claim 1, wherein the ion angle detector is grid-less, the ion beam traveling unobstructed from the aperture to the ion collector, and the front plate being configured to be in direct contact with a plasma comprising the ions.

7. A method of measuring ion angular distribution of a plasma, the method comprising:

producing an ion beam from the plasma at a source location;

moving an ion collector parallel to the ion beam from an initial distance from the source location to a final distance from the source location;

measuring ion flux from the ion beam using the ion collector while moving the ion collector parallel to the ion beam to obtain the ion flux as a function of distance from the source location; and obtaining the ion angular distribution from the ion flux and the distance from the source location.

8. The method of claim 7, further comprising:

obtaining measured ion angle as a function of the distance from the source location using a constant collection radius of the ion collector, wherein the ion angular distribution is obtained using the ion flux and the measured ion angle.

9. The method of claim 8, wherein obtaining the ion angular distribution comprises taking the derivative of the ion flux with respect to the measured ion angle.

10. The method of claim 7, further comprising:

measuring a maximum ion flux value at the initial distance from the source location using the ion collector, the ion beam being produced by an aperture at the source location; and obtaining beam divergence using a diameter of the aperture and a ratio of the maximum ion flux value to the ion flux measured while moving the ion collector parallel to the ion beam.

11. The method of claim 7, further comprising:

moving the ion collector perpendicular to the ion beam; and measuring the ion flux using the ion collector while moving the ion collector perpendicular to the ion beam to obtain off-axis ion flux information.

12. The method of claim 11, further comprising:

determining a position of maximum ion flux from the off-axis ion flux information; and moving the ion collector perpendicular to the ion beam to the position of maximum ion flux.

13. The method of claim 7, further comprising:

measuring the ion flux from the ion beam over a range of ion energies while the ion collector remains stationary at each of one or more distances in the inclusive range from the initial distance to the final distance.

14. A plasma system comprising:

a chamber configured to contain a plasma;

an ion angle detector disposed within the chamber, the ion angle detector comprising a front plate comprising an aperture configured to form an ion beam from the plasma, an ion collector configured to measure ion flux from the ion beam, and a first linear actuator mechanically coupled to the ion collector and configured to move the ion collector in a direction parallel to the ion beam; and a controller operatively coupled to the ion angle detector, the controller comprising a processor and a non-transitory computer-readable medium storing a program including instructions that, when executed by the processor, perform a method of measuring ion angular distribution of the plasma, the method comprising moving the ion collector parallel to the ion beam from an initial distance from the aperture to a final distance from the aperture using the first linear actuator, measuring ion flux from the ion beam using the ion collector while moving the ion collector parallel to the ion beam to obtain the ion flux as a function of distance from the aperture, and obtaining the ion angular distribution from the ion flux and the distance from the aperture.

15. The plasma system of claim 14, wherein the method further comprises obtaining measured ion angle as a function of the distance from the aperture using a constant collection radius of the ion collector, and wherein obtaining the ion angular distribution comprises taking the derivative of the ion flux with respect to the measured ion angle.

16. The plasma system of claim 14, wherein the ion angle detector further comprises a second linear actuator mechanically coupled to the ion collector, and wherein the method further comprises moving the ion collector perpendicular to the ion beam, and measuring the ion flux using the ion collector while moving the ion collector perpendicular to the ion beam to obtain off-axis ion flux information.

17. The plasma system of claim 16, wherein the method further comprises determining a position of maximum ion flux from the off-axis ion flux information, and moving the ion collector to the position of maximum ion flux.

18. The plasma system of claim 14, wherein the ion collector is a Faraday cup.

19. The plasma system of claim 14, wherein the ion angle detector further comprises an ion energy selector configured to prevent ions from the ion beam with energies below a selected energy threshold from reaching the ion collector, the ion angle detector also being an ion energy detector.

20. The plasma system of claim 14, wherein the ion angle detector is grid-less, the ion beam traveling unobstructed from the aperture to the ion collector, and the front plate being in direct contact with the plasma.

* * * * *